US 8,599,891 B2

(12) United States Patent
Maron et al.

(10) Patent No.: US 8,599,891 B2
(45) Date of Patent: Dec. 3, 2013

(54) LASER DIODE DRIVER

(75) Inventors: Vladimir Maron, Rehovot (IL); Leonid Finkelstein, Ashdod (IL); Itzhak Ziv, Rehovot (IL); Eyal Lebiush, Beer Sheva (IL); Alexander Ioffe, Beer Sheva (IL)

(73) Assignee: Soreq Nuclear Research Center, Nachal Soreq (IL)

( * ) Notice: Subject to any disclaimer, the term of this patent is extended or adjusted under 35 U.S.C. 154(b) by 0 days.

(21) Appl. No.: 13/425,661

(22) Filed: Mar. 21, 2012

(65) Prior Publication Data

US 2012/0243562 A1    Sep. 27, 2012

Related U.S. Application Data

(60) Provisional application No. 61/454,846, filed on Mar. 21, 2011.

(51) Int. Cl.
*H01S 3/00* (2006.01)

(52) U.S. Cl.
USPC ............... 372/38.02; 372/38.07; 372/29.015; 372/29.014; 372/29.01

(58) Field of Classification Search
USPC .......... 372/38.1–38.04, 38.02, 38.07, 29.015, 372/29.014, 29.01
See application file for complete search history.

(56) References Cited

U.S. PATENT DOCUMENTS

| | | | |
|---|---|---|---|
| 4,764,935 A | 8/1988 | Wilcox et al. | |
| 4,985,897 A | 1/1991 | Botez et al. | |
| 5,101,413 A | 3/1992 | Botez | |
| 5,307,369 A | 4/1994 | Kimberlin | |
| 5,796,276 A | 8/1998 | Phillips et al. | |
| 5,999,555 A | 12/1999 | Connors et al. | |
| 7,289,549 B2 | 10/2007 | Sun et al. | |
| 7,301,981 B2 | 11/2007 | Sun et al. | |
| 7,348,516 B2 | 3/2008 | Sun et al. | |
| 7,396,706 B2 | 7/2008 | Sun et al. | |
| 7,564,198 B2* | 7/2009 | Yamamoto et al. | 315/307 |
| 7,564,882 B2 | 7/2009 | Kim et al. | |
| 7,633,463 B2* | 12/2009 | Negru | 345/46 |
| 7,848,370 B2 | 12/2010 | Kewitsch et al. | |
| 2006/0291512 A1* | 12/2006 | Borschowa | 372/38.02 |
| 2010/0128748 A1 | 5/2010 | Robinson et al. | |
| 2010/0134041 A1* | 6/2010 | Radermacher et al. | 315/294 |
| 2010/0220756 A1* | 9/2010 | Krzysztof et al. | 372/38.02 |
| 2012/0189028 A1* | 7/2012 | Hoffman et al. | 372/38.07 |

FOREIGN PATENT DOCUMENTS

WO    WO 2008/129504 A1 * 10/2008

OTHER PUBLICATIONS

Bao, H.C et al; Multichannel Dual-Mode-Based Optical Pulse Source From a Single Laser Diode;IEEE Photonics Technology Letters, vol. 16, No. 3, Mar. 2004.

* cited by examiner

*Primary Examiner* — Kinam Park
(74) *Attorney, Agent, or Firm* — A.C. Entis-IP Ltd.

(57) ABSTRACT

Embodiments of the invention provide a laser light source comprising: a plurality of lasers connected in series; and a laser driver controllable to simultaneously drive a substantially same current through a combination of the lasers selectable from different combinations of lasers in the plurality of lasers and not through lasers in the plurality of lasers that are not in the combination.

11 Claims, 5 Drawing Sheets

LASER DIODE DRIVER

RELATED APPLICATIONS

The present application claims the benefit under 35 U.S.C. 119(e) of U.S. Provisional Applications 61/454,846 filed on Mar. 21, 2011, the disclosure of which is incorporated herein by reference.

FIELD OF THE INVENTION

Embodiments of the invention relate to providing a laser light source comprising a plurality of lasers.

BACKGROUND

Arrays comprising a plurality of semiconductor pulsed lasers are used to provide intense pulses of laser light by combining pulses of light from the lasers so that they overlap spatially and temporally to form a "combined pulse" of light. Temporal spread of triggering times of the lasers, variations in pulse shape of the pulses provided by the lasers and jitter in their respective rise times contribute to degrading spatial and temporal overlap of the pulses and reducing energy density and maximum intensity of the combined pulse. To an extent that all the combined pulses have a same pulse shape and can be made to spatially and temporally accurately coincide, optical energy of the pulses is contained in a smaller time and spatial volume, and energy density, and maximum pulse intensity of the combined pulse increases. Constraints on simultaneity of triggering the lasers and uniformity of pulse widths of light pulses they provide to generate a combined pulse become more stringent as the pulse widths of the light pulses and a desired pulse width of the combined pulse decreases. By way of example, for laser pulses having a rise time of about 10 ns (nanoseconds) and pulse width of about 60 ns it is generally advantageous to maintain synchronization of triggering times of the lasers and variations in their pulse widths to less than a few nanoseconds.

SUMMARY

An embodiment of the invention provides a laser light source comprising a plurality of "N" lasers electrically connected in series, and coupled to a laser diode driver controllable to simultaneously drive a substantially same current only through any selectable combination of any number of the lasers. The laser light source optionally comprises optics that directs light generated by the lasers to propagate through a same spatially localized region, hereinafter a focal region of the laser light source. Optionally the lasers are laser diodes.

In an embodiment of the invention, the laser diode driver comprises a power source connected to apply voltage across the series connected "chain" of N laser diodes and a different shorting switch for each laser diode, which bridges the laser diode. If the shorting switch of a given laser diode is closed, leads of the laser through which current is supplied to excite the diode are shorted and current generated by voltage applied by the power source to the chain of N laser diodes is shunted around and does not pass through the given laser diode.

In accordance with an embodiment of the invention, in a simultaneous mode of operation, the laser light source is operated to generate a combined laser light pulse at the focal region by a substantially simultaneous addition of light pulses from $N^*$ ($1 \leq N^* \leq N$) of the N lasers by first opening the shorting switches of $N^*$ of the lasers and closing the shorting switches of the remaining (N-$N^*$) lasers. The laser diode driver is then controlled to apply voltage provided by the power source to the laser chain for a desired amplitude of laser diode pulse current and duration of $\tau_w$ seconds. The voltage substantially simultaneously generates a same current in the $N^*$ lasers, which triggers the $N^*$ lasers to laser and generate pulses of width $\tau_w$. The pulses substantially simultaneously overlap in the focal region to produce a combined light pulse characterized by a pulse width substantially equal to $\tau_w$. If a maximum intensity of each of the pulses provided by the lasers is equal to "$I_o$" then a maximum intensity "$I_o(N^*)$" of the combined pulse is equal to about $N^* I_o$.

In an embodiment of the invention, the laser light source is operated in a consecutive mode of operation. In the consecutive mode light pulses are generated sequentially from $N^*$ ($1 \leq N^* \leq N$) of the N lasers to generate a combined light pulse having pulse width and pulse shape different form that of any one of the light pulses generated by one of the lasers.

In the discussion unless otherwise stated, adjectives such as "substantially" and "about" modifying a condition or relationship characteristic of a feature or features of an embodiment of the invention, are understood to mean that the condition or characteristic is defined to within tolerances that are acceptable for operation of the embodiment for an application for which it is intended.

This summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF FIGURES

Non-limiting examples of embodiments of the invention are described below with reference to figures attached hereto that are listed following this paragraph. Identical structures, elements or parts that appear in more than one figure are generally labeled with a same numeral in all the figures in which they appear. Dimensions of components and features shown in the figures are chosen for convenience and clarity of presentation and are not necessarily shown to scale.

DETAILED DESCRIPTION

Figure 1:
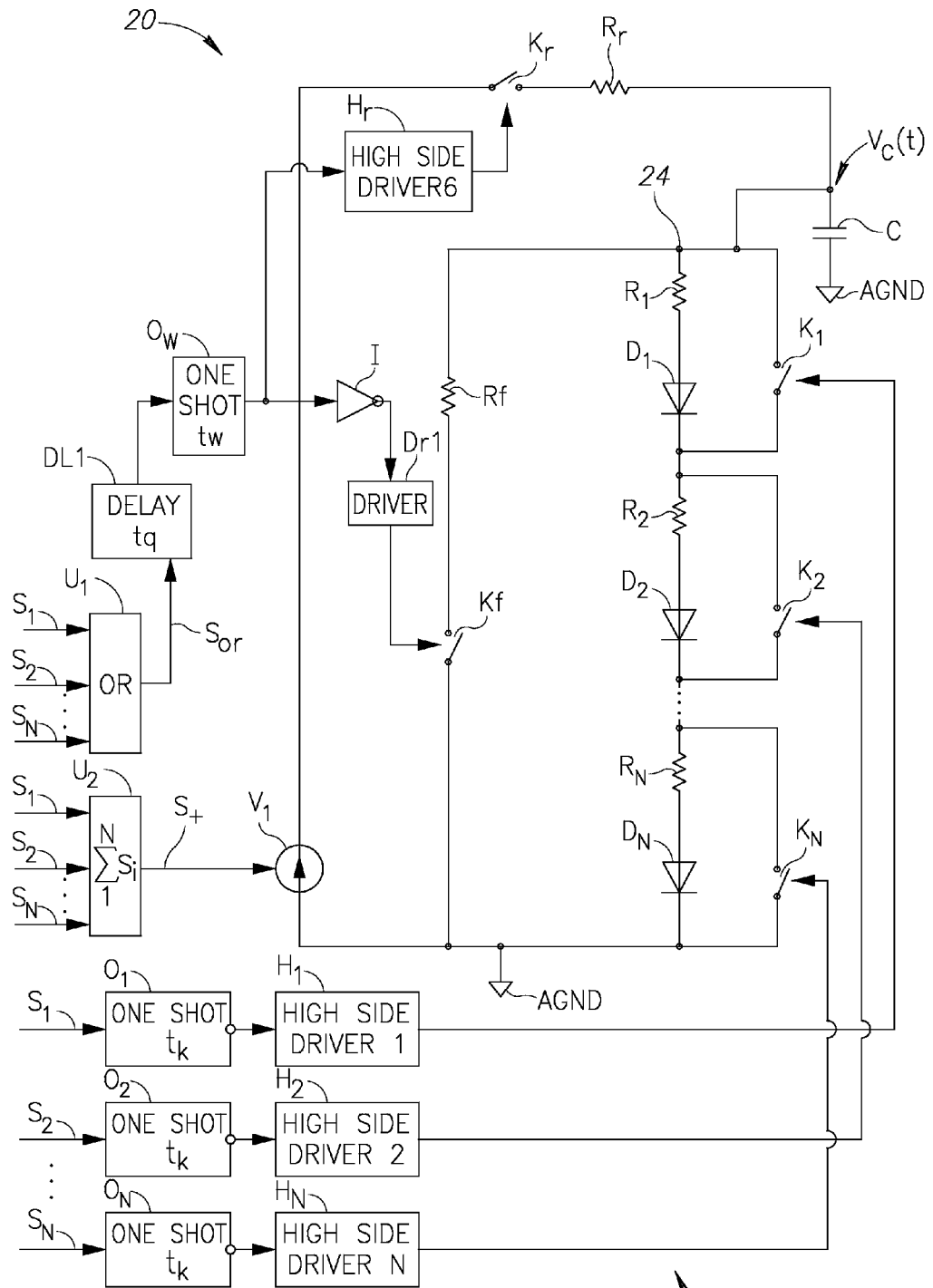
FIG. 1 schematically shows a laser light source comprising a laser diode driver and a plurality of laser diodes, in accordance with an embodiment of the invention.

FIG. 1 schematically shows a laser light source 20 optionally comprising a plurality of laser diodes $D_1, D_2, \ldots D_N$, connected in series between a node 24 and a common ground "AGND", and driven by a laser diode driver 22, in accordance with an embodiment of the invention.

In an embodiment of the invention, the laser diode driver comprises current limiting resistors $R_1, R_2, \ldots R_N$ connected in series with laser diodes $D_1, D_2, \ldots D_N$ respectively. Each laser diode $D_n$ of the laser diodes is bridged by its own shorting switch $K_n$ that is connected to a high side driver, $H_n$, controlled by pulses from a one shot circuit $O_n$. Optionally, shorting switches $K_1, K_2, \ldots K_N$ are normally closed. A logic level signal represented by $S_n$ controls output of one shot circuit $O_n$. Optionally, a high logic level for a logic level signal $S_n$ applied to the input of one shot circuit $O_n$ causes the one shot circuit to transmit a pulse having duration $t_k$ to high side driver $H_n$. The high side driver in turn generates a signal that opens and maintains shorting switch $K_n$ open for a time period $t_k$.

Optionally, laser diode driver 22 comprises a voltage source V1 having an output voltage controlled by an AND circuit "U2". U2 receives logic level signals $S_n$ that trigger one shot circuits $O_n$ and generates an output signal "$S_+$" that is proportional to the sum, $\Sigma S_n$, of the logic level signals. By way of example, if N* logic level signals $S_n$ are high, then the output signal $S_+$ generated by U2 is proportional to N*. The output signal is applied to voltage source V1 and controls the voltage provided by V1. Optionally, a voltage provided by voltage source V1 is linearly proportional to the output signal $S_+$ provided by U2 so that if N* logic level signals $S_n$ are high, the output of V1 is equal to N*v where v is a voltage level generated by V1 if N*=1.

An "OR" circuit U1 receives logic level signals $S_n$ and generates an output signal "$S_{or}$" if any of the logic level signals $S_n$ is high. U1 output signal $S_{or}$ is applied to a one shot circuit $O_w$ after being delayed by a time period $t_q$, optionally by a delay line DL1. In response to the signal from OR circuit U1, one shot circuit $O_w$ generates an "$O_w$ output pulse" having pulse width $t_w$. The $O_w$ output pulse is transmitted to a high side driver $H_r$ and an inverting amplifier I. In response to the $O_w$ output pulse, high side driver $H_r$ closes a charging switch $K_r$ and inverting amplifier I pulses a driver Dr1, which opens a "discharging" switch $K_f$. With charging switch $K_r$ closed and discharging switch $K_f$ open, voltage provided by voltage source V1 charges a pulse shaping capacitor C through a resistor $R_r$. When the $O_w$ output pulse ends, capacitor C discharges, at least partially, through a discharge resistor $R_f$.

In an embodiment of the invention, each of the $R_1, R_2, \ldots R_N$ is much larger than either $R^r$ or $R_f$ and optionally is equal to a same value "R". Under these conditions, the rise and fall times, "$\tau_r$," and "$\tau_f$", for charging and discharging capacitor C are determined respectively by capacitance of capacitor C and resistances $R_r$ and $R_f$ and are equal respectively to $R_rC$ and $R_fC$.

Therefore, if N* logic level signals $S_n$ go high at a time $t_o$, N* shorting switches $K_n$ are opened at about time $t_o$, and voltage source V1 produces a voltage N*v. which at a time $(t_o+t_q)$ when charging switch $K_r$ is closed and discharging switch $K_f$ is opened by a $O_w$ output pulse, begins charging pulse shaping capacitor C. If voltage on the capacitor is represented by $v_C(t)$ then as a function of time t, $V_C(t)$ may be estimated as $$V_C(t) = v \cdot N* \cdot \frac{\sum_1^{N*} R_n}{R_r + \sum_1^{N*} R_n}\left(1 - e^{-\frac{t-(t_o+t_q)}{\tau_r}}\right) = v \cdot N* \cdot \left(1 - e^{-\frac{t-(t_o+t_q)}{\tau_r}}\right). \quad 1)$$

Similarly, the fall of voltage $v_C(t)$ following opening of charging switch $K_r$ and closing of discharging switch $K_f$ at time $(t_o+t_q+t_w)$ when the $O_w$ output pulse ends may be estimated as $$V_C(t) = v \cdot N* \cdot \left(e^{-\frac{t-(t_o+t_q+t_w)}{\tau_f}}\right). \quad 2)$$

Using equations 1) and 2), the current I(t) that flows through the N* laser diodes whose associated shorting switches are open becomes for time t that satisfies $(t_o+t_q) \le t \le (t_o+t_q+t_w)$;

$$I(t) = (v \cdot N* / N*R) \cdot \left(1 - e^{-\frac{t-(t_o+t_q)}{\tau_r}}\right) = (v/R) \cdot \left(1 - e^{-\frac{t-(t_o+t_q)}{\tau_r}}\right); \quad 4)$$

and for time t that satisfies $(t_o+t_q+t_w) < t$;

$$I(t) = (v/R) \cdot \left(e^{-\frac{t-(t_o+t_q+t_w)}{\tau_f}}\right). \quad 5)$$

Figure 2:
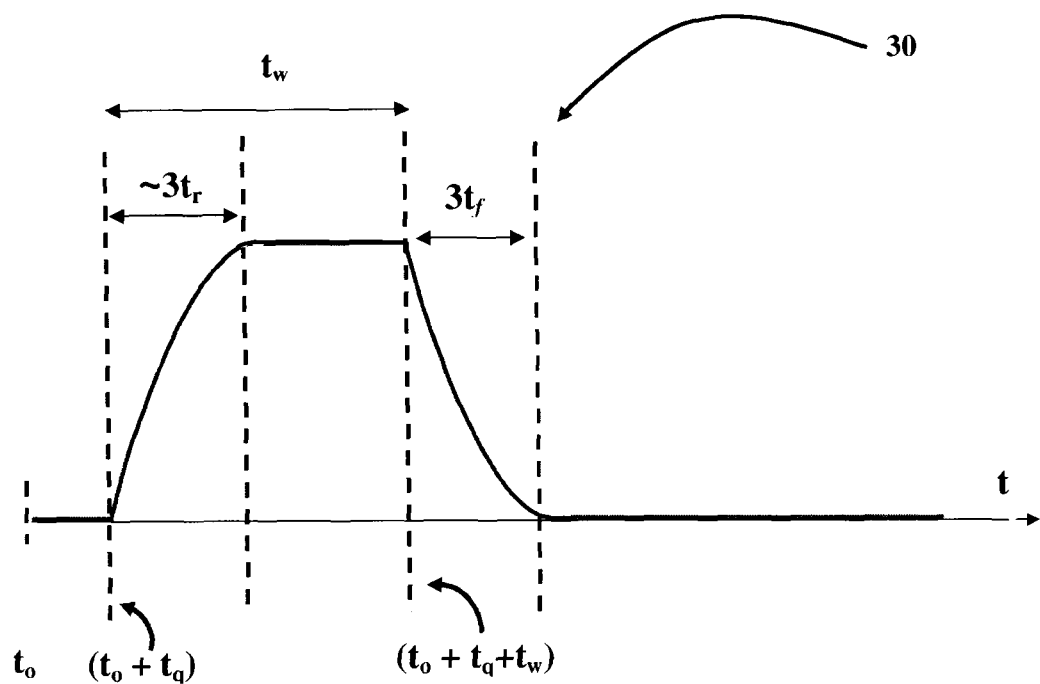
FIG. 2 shows a graph of a current pulse applied to excite laser diodes in the laser light source shown in FIG. 1.

Assuming that the pulse width $t_w$ of an output pulse generated by one shot circuit $O_w$ is relatively long compare to rise time $\tau_r$, and fall time $\tau_f$, a graph of current I(t) through the N* laser diodes as a function of time is substantially as represented in a graph 30 shown in FIG. 2.

Figure 3A:
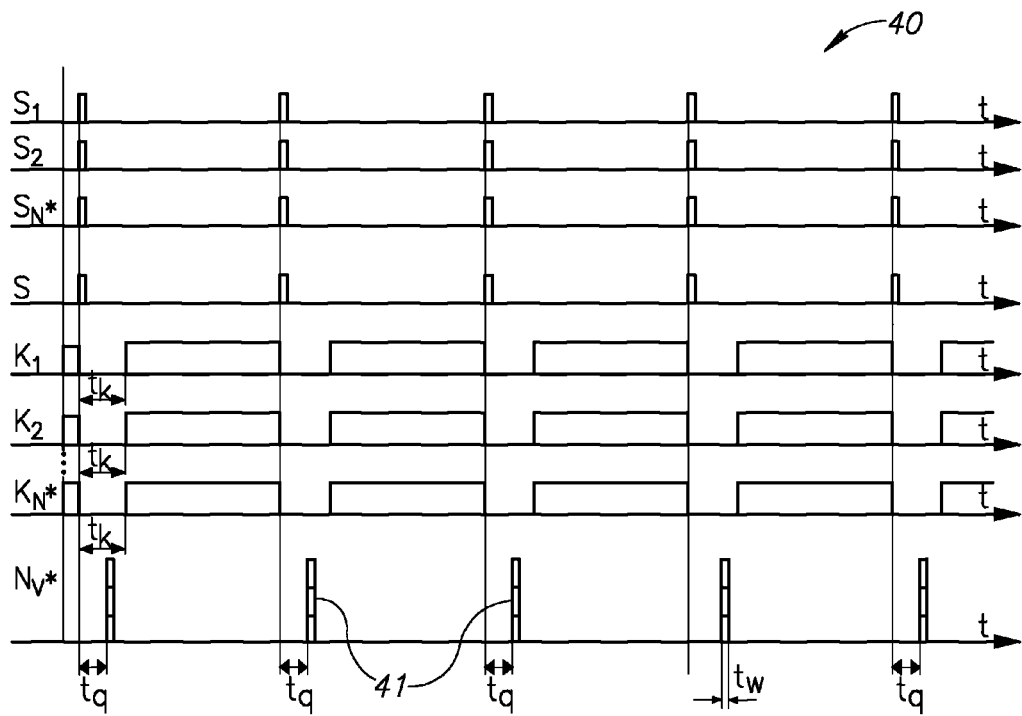
FIG. 3A shows a timing diagram of logic levels and voltage pulses generated by the laser diode driver comprised in light source shown in FIG. 1 during its operation in a simultaneous mode, in accordance with an embodiment of the invention.

A timing diagram 40 shown in FIG. 3A shows relative timing of the N* logic level signals $S_n$ periodically going high at a substantially same time, output signals S generated by OR circuit U1 responsive to logic level signals $S_n$, and output signals generated by high side drivers $H_n$ responsive to logic level signals $S_n$ that open N* shorting switches $K_n$ (FIG. 1). Logic level signals $S_n$, output signals S and signals generated by high side drivers $H_n$ are shown along time lines labeled $S_1 \ldots S_{N*}$, S, and $K_1 \ldots K_{N*}$ respectively. Pulses of voltage having amplitude Nv* and shape approximately as shown in FIG. 2 that are generated by voltage source V1 responsive to the periodically high N* logic levels are schematically represented by voltage pulses 41 shown along a time line labeled Nv* in graph 40. Voltage pulses 41 are applied to the N* laser diodes in the chain of laser diodes $D_1 \ldots D_n$ (FIG. 1) whose associated shorting switches $K_n$ are switched open by high side drivers $H_1 \ldots H_n$.

Figure 3B:
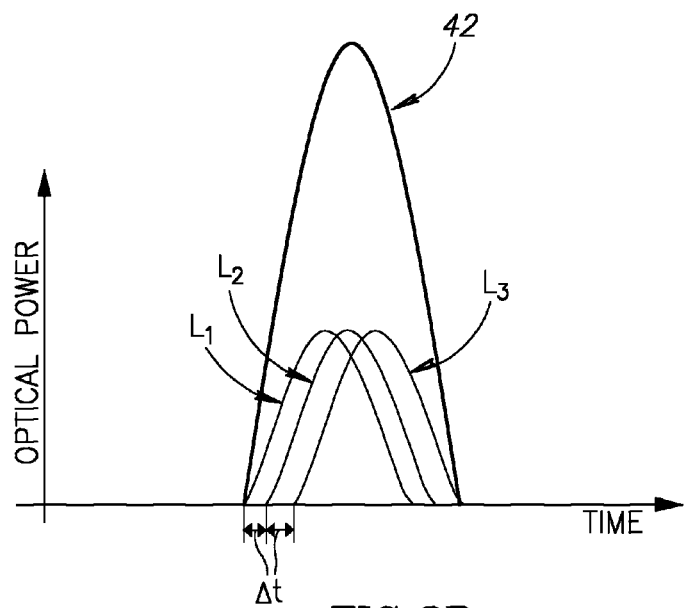
FIG. 3B schematically shows a combined light pulse formed by addition of light pulses from a plurality of laser diodes in the light source shown in FIG. 1 by operation of the laser light source in the simultaneous mode, in accordance with an embodiment of the invention.

It is noted that in accordance with an embodiment of the invention, voltage pulses 41 generate a same current I(t) that simultaneously flows in each of the N* laser diodes $D_n$ and that current I(t) is independent of N*. Each of the N* laser diodes $D_n$ substantially simultaneously radiates a light pulse having substantially a same shape and the light pulses combine to produce a combined light pulse having intensity N*$I_o$, where $I_o$ is an intensity of one of the light pulses. The rise time, fall time, and length of the optical pulses provided by each of the N* laser diodes $D_n$ are controlled respectively by $R_r, R_f$, and the pulse width $t_w$ of pulses provided by one shot circuit $O_v$. FIG. 3B schematically shows by way of example, a combined light pulse 42 provided by laser light source 20 operating with N* equal to 3, time jitter Δt, and generating light pulses L1, L2, and L3, optionally from laser diodes D1, D2, and D3 respectively.

By way of a numerical example, a laser source comprising a plurality of pulsed lasers and a laser diode driver in accordance with an embodiment of the invention similar to laser diode driver 22 generated a plurality of light pulses having pulse rise times about 12 ns and combined them with time jitter less than about 2 ns.

Whereas in the above discussion laser light source 20 and laser diode driver 22 are described as operating in a simultaneous mode in which N* of N laser diodes $D_1 \ldots D_N$ are driven simultaneously by a same current to generate a combined light pulse, laser light source 20 is not limited to operating in a "simultaneous mode". In an embodiment of the invention, a light source in accordance with an embodiment of the invention such as laser light source 20, is operated in a consecutive mode. In a consecutive mode N* laser diodes of the N laser diodes $D_1 \ldots D_N$ are driven consecutively to generate a combined light pulse optionally having a pulse width larger than a pulse width of a light pulse generated by a single laser diode $D_1 \ldots$ or $D_N$ and a pulse shape different from that generated by the single laser diode.

Figure 3C:
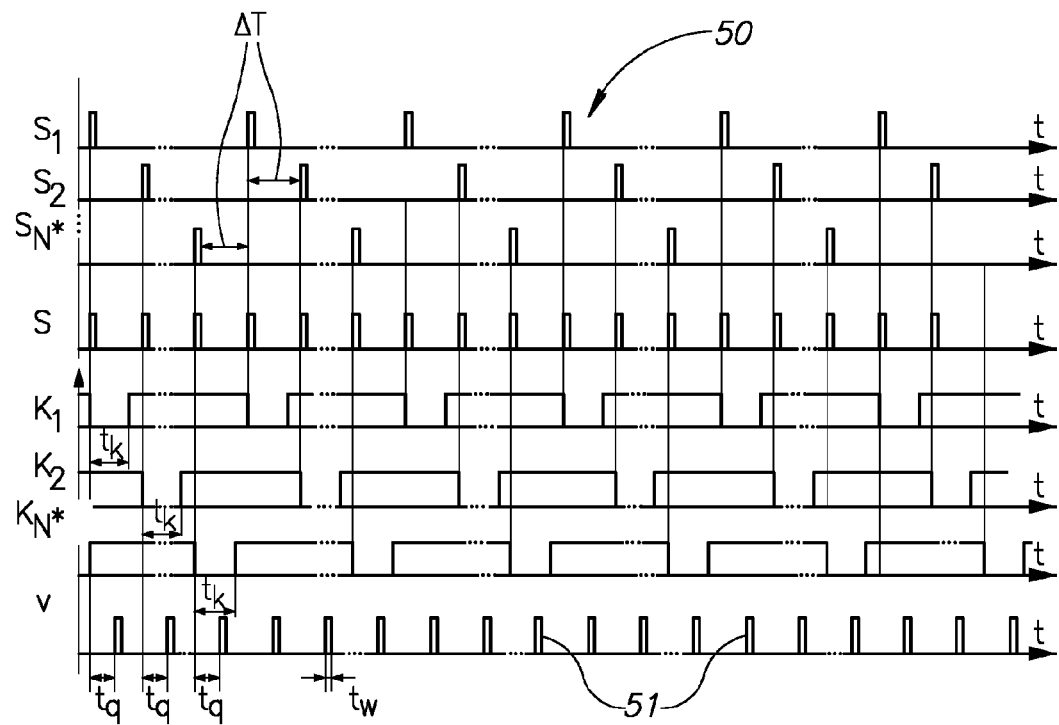
FIG. 3C shows a timing diagram of logic levels and voltage pulses generated by the laser diode driver comprised in light source shown in FIG. 1 during its operation in a consecutive mode, in accordance with an embodiment of the invention.

A timing diagram 50 shown in FIG. 3C shows relative timing of logic level signals $S_n$ and voltage pulses applied to laser diodes $D_1 \ldots D_{N^*}$ during operation of laser light source 20 in a consecutive mode of operation in accordance with an embodiment of the invention. The timing diagram shows N* logic level signals $S_n$ periodically going high consecutively at time intervals ΔT, output signals $S_{or}$ generated by OR circuit U1 responsive to logic level signals $S_n$, and output signals generated by high side drivers $H_n$ responsive to logic level signals $S_n$ that open N* shorting switches $K_n$ (FIG. 1). Consecutive logic level signals $S_n$ separated by time intervals ΔT, output signals $S_{or}$ and signals generated by high side drivers $H_n$ are shown along time lines labeled $S_1 \ldots S_{N^*}$, S, and $K_1 \ldots K_{N^*}$ respectively. Pulses of voltage having amplitude v and shape approximately as shown in FIG. 2 that are generated by voltage source V1 responsive to the high consecutive N* logic levels of signals $S_n$ are schematically represented by pulses 51 shown along a time line labeled v in graph 50.

Figure 3D:
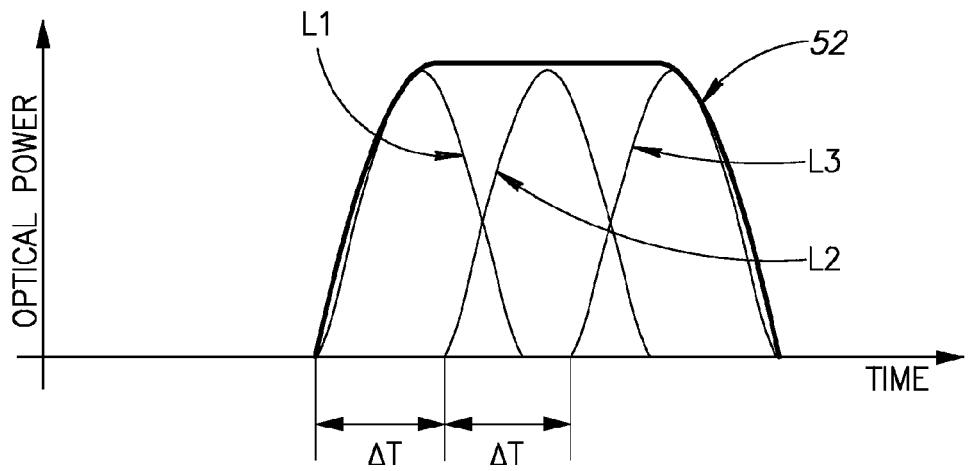
FIG. 3D shows a combined light pulse generated by the light source by operation in the consecutive mode of operation, in accordance with an embodiment of the invention.

FIG. 3D schematically shows by way of example, a combined light pulse 52 provided by laser light source 20 operating in a consecutive mode with N* equal to 3, to generate consecutive light pulses L1, L2, and L3, optionally from laser diodes $D_1$, $D_2$, and $D_3$ respectively.

Figure 4:
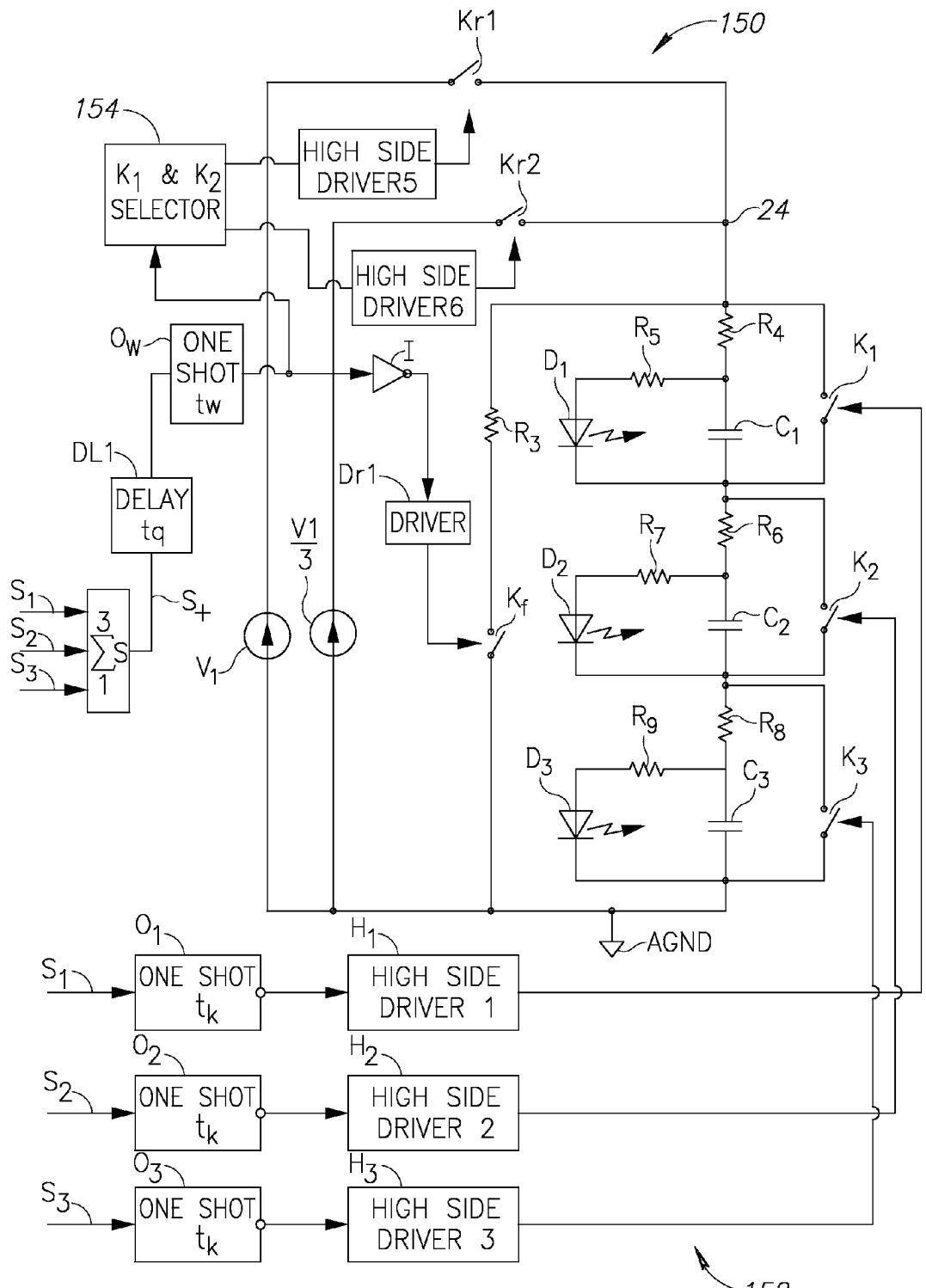
FIG. 4 schematically shows another laser light source in accordance with an embodiment of the invention.

FIG. 4 schematically shows a laser light source 150 comprising optionally three laser diodes $D_1$, $D_2$ and $D_3$ and a laser diode driver 152, in accordance with an embodiment of the invention. Laser diode driver 152 operates similarly to laser diode driver 22 but optionally comprises two voltage sources that provide fixed voltages V1 and V1/3, rather than comprising a variable voltage source shown in FIG. 1, which is controlled by an AND circuit such as AND circuit U2. Voltage source V1/3 provides optionally one third the voltage provided by voltage source V1 and is used to drive laser diodes $D_1$, $D_2$ and $D_3$ one at a time when laser light source 150 is operated in a consecutive mode. Voltage source V1 is used to simultaneously drive all laser diodes $D_1$, $D_2$, and $D_3$ when laser light source 150 operates in a simultaneous mode. A selector circuit 154 is controllable to determine which voltage source V1 or V1/3 is operative.

Optionally, each laser diode $D_1$, $D_2$, and $D_3$ is associated with its own current limiting resistor, $R_5$, $R_7$, and $R_9$ respectively and its own capacitor $C_1$, $C_2$, and $C_3$ and associated charging resistor $R_4$, $R_6$, and $R_8$. In an embodiment of the invention the resistors and/or capacitors associated with any two of laser diodes $D_1$, $D_2$, and $D_3$ may be different. It is noted that light pulse shapes provided by each laser diode, $D_1$, $D_2$, and $D_3$ may be changed by changing its associated capacitance and/or an associated resistance.

In the description and claims of the present application, each of the verbs, "comprise" "include" and "have", and conjugates thereof, are used to indicate that the object or objects of the verb are not necessarily a complete listing of components, elements or parts of the subject or subjects of the verb.

Descriptions of embodiments of the invention in the present application are provided by way of example and are not intended to limit the scope of the invention. The described embodiments comprise different features, not all of which are required in all embodiments of the invention. Some embodiments utilize only some of the features or possible combinations of the features. Variations of embodiments of the invention that are described, and embodiments of the invention comprising different combinations of features noted in the described embodiments, will occur to persons of the art. The scope of the invention is limited only by the claims

The invention claimed is:

1. A laser light source comprising:
a plurality of lasers connected in series;
at least one voltage source controllable to apply a voltage to the series connected lasers;
a different shorting switch for each laser of the plurality of lasers that bridges the laser and is independently controllable by a different logic level signal to shunt current generated by the voltage applied by the voltage source to the series connected lasers so that the current flows around the laser and not through the laser; and
an AND circuit that receives the different logic level signals that control the shorting switches and generates a first output signal responsive to a sum of the logic level signals that controls the maximum voltage provided by the at least one voltage source.

2. The laser light source according to claim 1 and comprising a capacitor that is connected in parallel to the plurality of lasers and is charged substantially to the maximum voltage by the voltage source.

3. The laser light source according to claim 2 wherein the capacitor is charged to the maximum magnitude voltage by the at least one voltage source through a first resistance connected between the voltage source and the capacitor.

4. The laser light source according to claim 3 wherein the first resistance and capacitance of the capacitor substantially determine the rise time for charging the capacitor.

5. The laser light source according to claim 4 comprising a second resistance connected in parallel with the plurality of lasers and wherein the capacitor discharges through the combination of lasers and the second resistance.

6. The laser light source according to claim 5 wherein the second resistance substantially determines a fall time for discharging the capacitor.

7. The laser light source according to claim 6 and comprising an OR circuit that receives the logic level signals and produces a second output signal responsive to the received logic level signals.

8. The laser light source according to claim 7 and comprising a one shot circuit that receives the second output signal following a predetermined delay and generates a third output signal having a predetermined duration.

9. The laser light source according to claim 8 and comprising first and second switches that respectively connect the voltage source to the first resistance and the second resistance to ground, and wherein for the duration of the third output signal, the first switch is closed and conducting, and the second switch is open and non conducting.

10. The laser light source according to claim 1 wherein light from all the lasers passes through a same localized region of space where light from the combination of lasers overlap spatially.

11. The laser light source according to claim 1 wherein the plurality of lasers comprises a laser diode.

* * * * *